United States Patent
Jain et al.

(10) Patent No.: US 11,296,190 B2
(45) Date of Patent: Apr. 5, 2022

(54) FIELD EFFECT TRANSISTORS WITH BACK GATE CONTACT AND BURIED HIGH RESISTIVITY LAYER

(71) Applicant: GLOBALFOUNDRIES U.S. INC., Santa Clara, CA (US)

(72) Inventors: Vibhor Jain, Essex Junction, VT (US); Anthony K. Stamper, Burlington, VT (US); Steven M. Shank, Jericho, VT (US); John J. Ellis-Monaghan, Grand Isle, VT (US); John J. Pekarik, Underhill, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 35 days.

(21) Appl. No.: 16/743,589

(22) Filed: Jan. 15, 2020

(65) Prior Publication Data
US 2021/0217849 A1 Jul. 15, 2021

(51) Int. Cl.
| | | |
|---|---|---|
| *H01L 29/10* | (2006.01) | |
| *H01L 27/12* | (2006.01) | |
| *H01L 21/84* | (2006.01) | |
| *H01L 29/78* | (2006.01) | |
| *H01L 21/74* | (2006.01) | |

(52) U.S. Cl.
CPC ........ *H01L 29/1087* (2013.01); *H01L 21/743* (2013.01); *H01L 21/84* (2013.01); *H01L 27/1203* (2013.01); *H01L 29/1083* (2013.01); *H01L 29/7838* (2013.01)

(58) Field of Classification Search
CPC ............. H01L 29/1087; H01L 29/1083; H01L 29/7838; H01L 27/1203; H01L 21/84; H01L 21/743
See application file for complete search history.

(56) References Cited

U.S. PATENT DOCUMENTS

| | | | |
|---|---|---|---|
| 5,091,330 A | * | 2/1992 | Cambou ........... H01L 21/76264 148/DIG. 12 |
| 5,374,564 A | | 12/1994 | Bruel |

(Continued)

FOREIGN PATENT DOCUMENTS

| | | |
|---|---|---|
| KR | 20070118626 | 12/2007 |
| TW | 201537637 | 10/2015 |
| WO | 2016081363 | 5/2016 |

OTHER PUBLICATIONS

Zhao et al., "Power and performance comparision of body bias in 28HPC and back bias in 22FDX", IEEE, 2017, 3 pages.

(Continued)

*Primary Examiner* — Sitaramarao S Yechuri
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to field effect transistors with back gate contact and buried high resistivity layer and methods of manufacture. The structure includes: a handle wafer comprising a single crystalline semiconductor region; an insulator layer over the single crystalline semiconductor region; a semiconductor layer over the insulator layer; a high resistivity layer in the handle wafer, separated from the insulator layer by the single crystalline semiconductor region; and a device on the semiconductor layer.

19 Claims, 3 Drawing Sheets

(56) References Cited

U.S. PATENT DOCUMENTS

| | | | |
|---|---|---|---|
| 6,177,708 B1 | 1/2001 | Kuang et al. | |
| 6,258,688 B1 | 7/2001 | Tsai | |
| 6,743,662 B2* | 6/2004 | Fathimulla | H01L 21/76254 148/DIG. 12 |
| 8,299,537 B2 | 10/2012 | Greco et al. | |
| 8,466,036 B2 | 6/2013 | Brindle et al. | |
| 9,129,800 B2 | 9/2015 | Allibert et al. | |
| 9,269,591 B2 | 2/2016 | Kalnitsky et al. | |
| 9,923,527 B2 | 5/2018 | McKay | |
| 10,192,779 B1 | 1/2019 | Shank et al. | |
| 2006/0284247 A1* | 12/2006 | Augustine | H01L 21/8258 257/338 |
| 2009/0218655 A1* | 9/2009 | Degani | H01L 28/10 257/528 |
| 2012/0299080 A1* | 11/2012 | Dennard | H01L 27/1203 257/316 |
| 2015/0054081 A1* | 2/2015 | Adam | H01L 27/13 257/350 |
| 2015/0064853 A1* | 3/2015 | Basker | H01L 27/10873 438/155 |
| 2015/0228714 A1 | 8/2015 | Gorbachov et al. | |
| 2017/0033135 A1 | 2/2017 | Field et al. | |
| 2017/0098474 A1* | 4/2017 | Tran | G11C 16/26 |
| 2017/0287953 A1* | 10/2017 | Wang | H01L 27/13 |
| 2017/0316968 A1* | 11/2017 | Peidous | H01L 21/76254 |
| 2018/0096884 A1 | 4/2018 | Shank et al. | |
| 2018/0138298 A1* | 5/2018 | Liu | H01L 21/02428 |
| 2018/0315783 A1 | 11/2018 | Wang et al. | |
| 2019/0057868 A1 | 2/2019 | Englekirk et al. | |

OTHER PUBLICATIONS

Taiwanese Office Action in TW Application No. 109144313 dated Oct. 6, 2021, 7 pages.
Taiwanese Notice of Allowance in TW Application No. 109144313 dated Jan. 11, 2021, 4 pages.

* cited by examiner

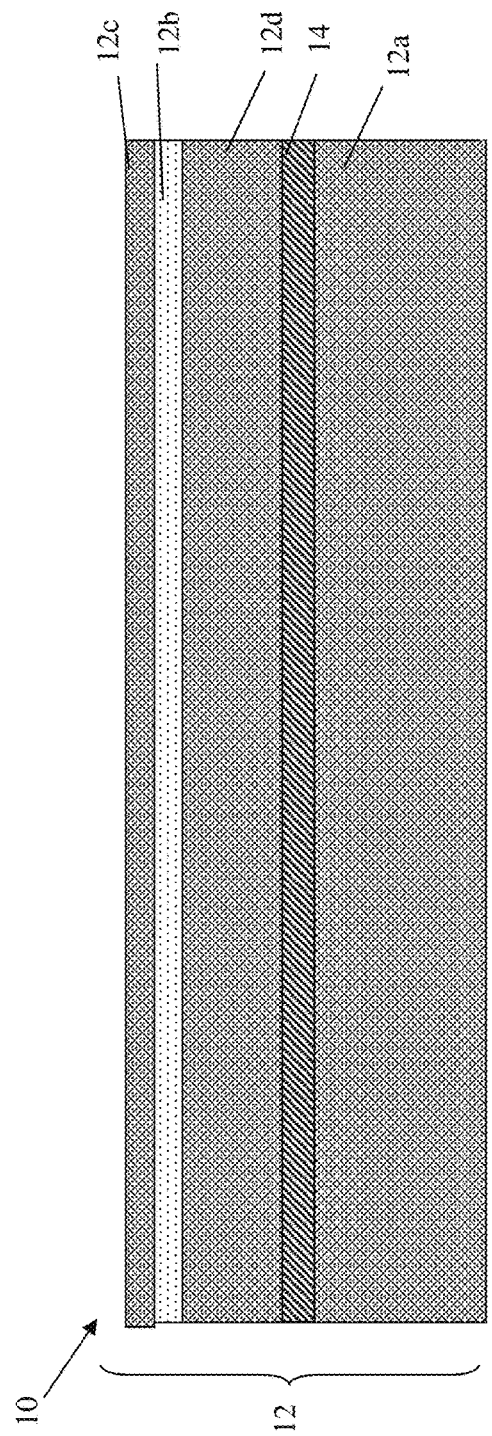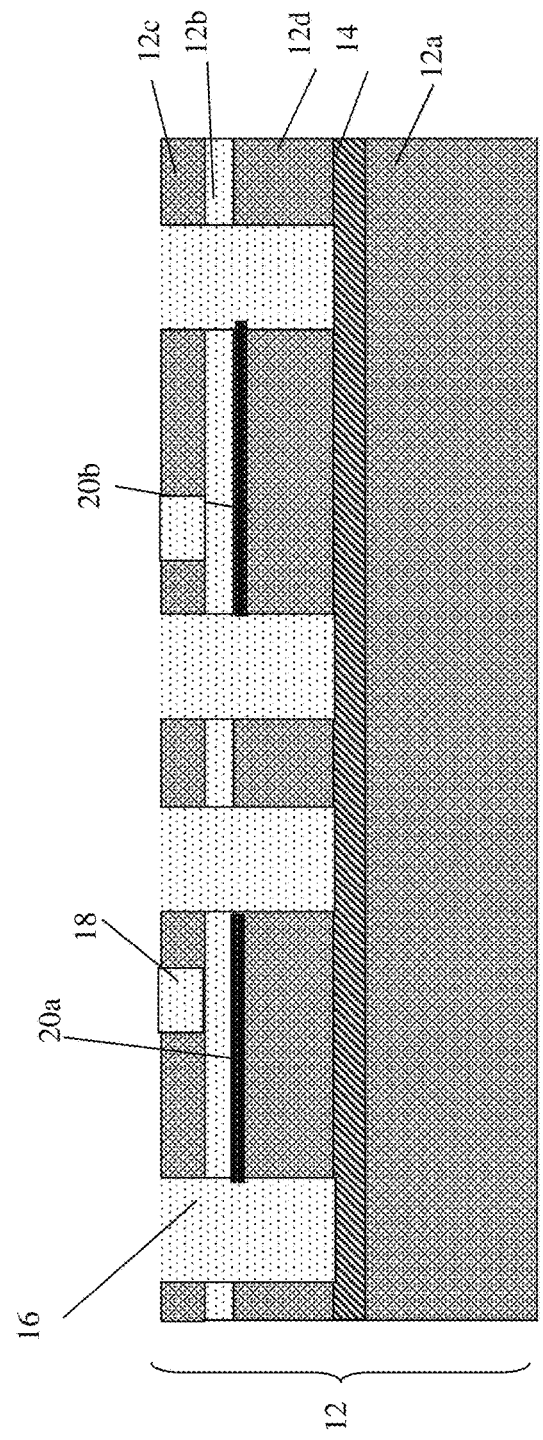

FIELD EFFECT TRANSISTORS WITH BACK GATE CONTACT AND BURIED HIGH RESISTIVITY LAYER

FIELD OF THE INVENTION

The present disclosure relates to semiconductor structures and, more particularly, to field effect transistors with back gate contact and buried high resistivity layer and methods of manufacture.

BACKGROUND

Bulk silicon substrates are less costly than silicon-on-insulator (SOI) substrates. Generally, an SOI substrate includes a thin device layer of silicon, a handle substrate, and a thin buried oxide (BOX) layer, physically separating and electrically isolating the device layer from the handle substrate. Devices fabricated using SOI technologies may exhibit certain performance improvements in comparison with comparable devices built in a bulk silicon substrate. For example, in contrast to an SOI substrate, a bulk silicon substrate is characterized by poor device isolation from harmonic generation. High resistivity wafers with a trap rich layer touching the BOX can be used as the handle substrate, but the presence of a trap rich layer does not allow for the formation of body contacts.

SUMMARY

In an aspect of the disclosure, a structure comprises: a handle wafer comprising a single crystalline semiconductor region; an insulator layer over the single crystalline semiconductor region; a semiconductor layer over the insulator layer; a high resistivity layer in the handle wafer, separated from the insulator layer by the single crystalline semiconductor region; and a device on the semiconductor layer.

In an aspect of the disclosure, a structure comprises: a wafer comprised of a single crystal region below a buried oxide layer and a semiconductor layer above the buried oxide layer; at least one well formed in the single crystal region, below the buried oxide layer; a polysilicon layer embedded within the wafer and separated from the at least one well and the buried oxide layer by the single crystal region; a device on the semiconductor layer; and back gate contacts extending through the semiconductor layer and contacting the at least one well.

In an aspect of the disclosure, a structure comprises at least one field effect transistor on a semiconductor on insulator wafer comprised of a high resistance poly layer separated from a buried oxide layer and a well of the at least one field effect transistor by a single crystalline region of the semiconductor on insulator wafer.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 1 shows a wafer with a high resistivity layer, amongst other features, in accordance with aspects of the present disclosure.

FIG. 2 shows shallow trench isolation regions and wells, amongst other features, in accordance with aspects of the present disclosure.

DETAILED DESCRIPTION

Figure 3:
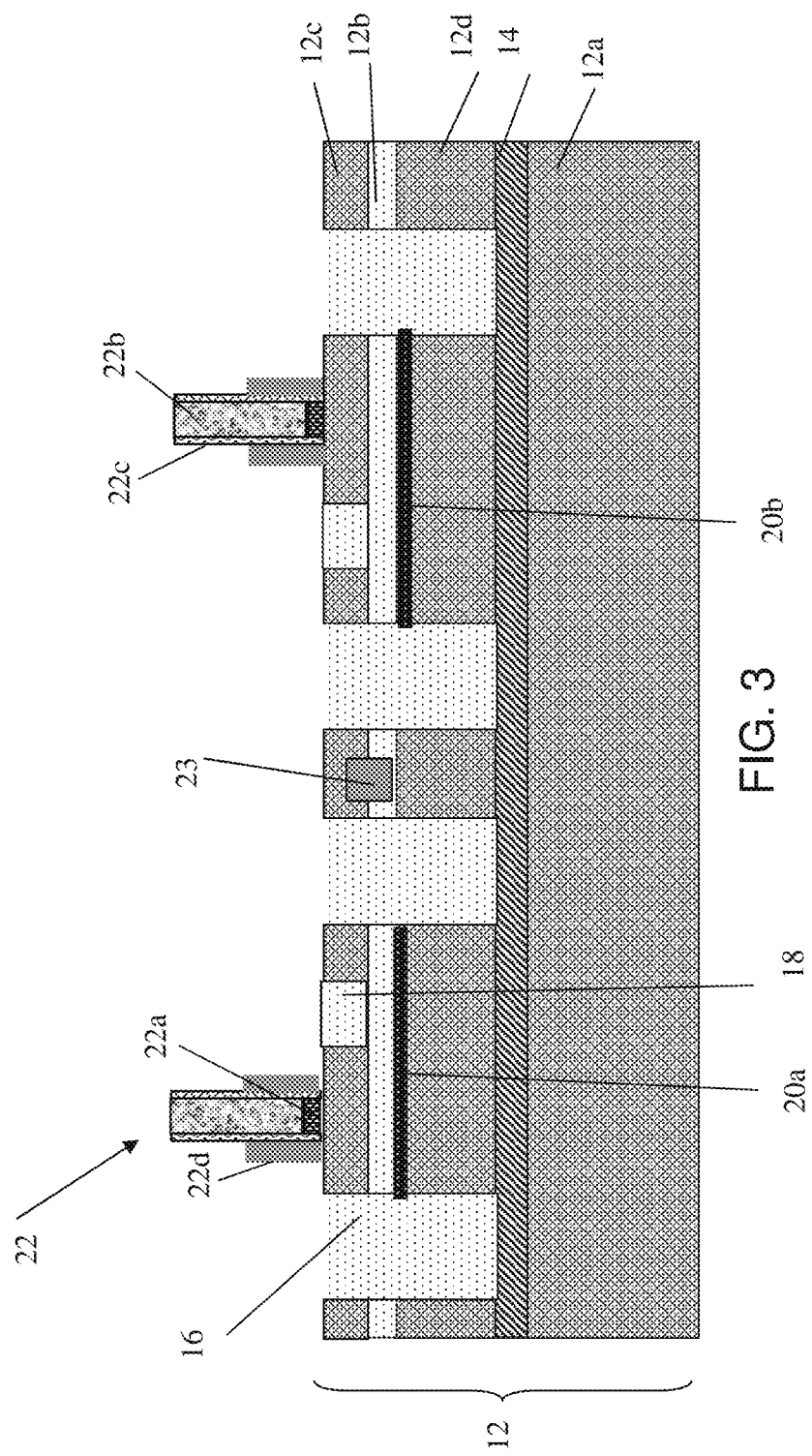
FIG. 3 shows transistors, amongst other features, in accordance with aspects of the present disclosure.

The present disclosure relates to semiconductor structures and, more particularly, to field effect transistors with back gate contact(s) and a buried high resistivity layer and methods of manufacture. More specifically, the present disclosure is directed to field effect transistors formed on semiconductor-on-insulator (SOI) technologies with back gate contact(s) and a buried high resistivity layer. In embodiments, the buried high resistivity layer is a trap rich polysilicon material buried within a single crystal wafer. Advantageously, the structures disclosed herein preserve back bias contact and enable improved linearity and RF performance, with improved isolation.

In more specific embodiments, the field effect transistors include a body contact in a single crystal handle wafer (wafer handler) with a high resistance layer. In embodiments, the high resistance layer is a trap rich polysilicon layer that is buried in the handle wafer and which is not in contact with the buried insulator layer (e.g., BOX) of the SOI technologies. That is, a single crystal silicon region separates the high resistivity polysilicon layer and the buried insulator layer (e.g., BOX). This enables the formation of body bias regions/wells in the handle wafer. Also, by utilizing the structures described herein, the following advantages, amongst others, can be achieved: (i) improved linearity with the trap rich (high resistivity) buried layer for switch devices; (ii) passive device performance benefits with the high resistivity layer for inductance, capacitance, and resistance (LCR); (iii) improved capacitance to the substrate including, e.g., improved gain (noise figure (NF)); and (iv) improved device-to-device isolation, i.e., with shared well devices also showing improved isolation.

The transistor(s) of the present disclosure can be manufactured in a number of ways using a number of different tools. In general, though, the methodologies and tools are used to form structures with dimensions in the micrometer and nanometer scale. The methodologies, i.e., technologies, employed to manufacture the transistor(s) of the present disclosure have been adopted from integrated circuit (IC) technology. For example, the structures are built on wafers and are realized in films of material patterned by photolithographic processes on the top of a wafer. In particular, the fabrication of the transistor(s) uses three basic building blocks: (i) deposition of thin films of material on a substrate, (ii) applying a patterned mask on top of the films by photolithographic imaging, and (iii) etching the films selectively to the mask.

FIG. 1 shows a wafer with a high resistivity layer, amongst other features, in accordance with aspects of the present disclosure. More specifically, the wafer 10 includes a handle wafer 12 used as a front end module, and which can have a high resistivity for RF device applications. The handle wafer 12 can be representative of semiconductor-on-insulator (SOI) technology. The SOI technology can be, for example, a fully depleted SOI (FDSOI) or partially depleted SOI (PDSOI). It should be understood by those of skill in the art that the handle wafer 12 can be a supporting substrate in SOI technologies. For example, the handle wafer 12 can, bulk Si or other semiconductor substrates with a polished or etched backside.

In embodiments, the handle wafer 12 includes a single crystalline material 12a comprised of, e.g., single crystalline Si material. In alternative embodiments, the single crystalline material 12a can be other single crystalline semiconductor materials such as, e.g., SiGe, SiC, etc. An insulator or dielectric layer 12b (e.g., buried oxide layer (BOX)) is bonded or deposited onto the single crystalline material 12a using conventional thermal oxidation process or other processes known to those of skill in the art, i.e., separation by implantation of oxygen (SIMOX) and/or other suitable process, such that no further explanation is required for a complete understanding of the present disclosure. A substrate 12c is deposited over or bonded directly to the insulator layer 12b. The substrate 12c can be single crystalline Si or other suitable single crystalline substrate as described herein.

Still referring to FIG. 1, a high resistivity layer 14 is embedded within the handle wafer 12. More specifically, the high resistivity layer 14 is embedded below the insulator layer 12b, completely separated therefrom by the single crystalline material, e.g., single crystalline material region 12d. In this way, the high resistivity layer 14 does not contact or touch the insulator layer 12b. In embodiments, the high resistivity layer 14 can be a trap rich polysilicon material that is fabricated by an implantation process followed by a thermal anneal process, prior to the formation of the substrate 12c and insulator layer 12b.

In embodiments, the high resistivity layer 14 can be formed by an implant process (which forms an amorphous material), below a critical dose that prevents recrystallization of the handle wafer 12, e.g., single crystalline material 12a. More specifically, the implant process can be at a dosage level of 1E14 to 5E15, and in more preferable embodiments, 1E15. The implant can argon or other inert gases such as nitrogen or oxygen, etc. Following the implantation process, the handle wafer 12 is subjected to a rapid thermal anneal process to recrystallize the surface of the handle wafer 12, forming a single crystalline material region 12d. The rapid thermal anneal process will also leave a trap rich polysilicon layer 14 under the recrystallized region (layer) 12d. The rapid thermal anneal process can be at a temperature of between 900° C. to 1150° C. from 0 to 10 seconds. It should be understood by those of skill in the art that the trap rich polysilicon layer 14 will advantageously provide improved linearity and will be capable of pinning back a gate bias.

FIG. 2 shows shallow trench isolation regions and diffusion or well regions, amongst other features, in accordance with aspects of the present disclosure. In embodiments, shallow trench isolation regions 16 can have a depth adjusted to extend to the high resistivity layer 14 to highly isolate any subsequently formed devices. In embodiments, the shallow trench isolation regions 16 can be formed by conventional lithography, etching and deposition methods known to those of skill in the art. For example, a resist formed over the substrate 12c is exposed to energy (light) to form a pattern (opening). An etching process with a selective chemistry, e.g., reactive ion etching (RIE), will be used to form one or more trenches in the substrate 12c, insulator layer 12b and the single crystalline region 12d through the openings of the resist. The resist can then be removed by a conventional oxygen ashing process or other known stripants. Following the resist removal, insulator material (e.g., oxide) can be deposited by any conventional deposition processes, e.g., chemical vapor deposition (CVD) processes.

Any residual material on the surface of the substrate 12c can be removed by conventional chemical mechanical polishing (CMP) processes.

Still referring to FIG. 2, optional shallow trench isolation regions 18 are formed within the substrate 12c, extending to the insulator layer 12b. In embodiments, the optional shallow trench isolation regions 18 can also extend partially into the BOX layer 12b. The optional shallow trench isolation regions 18 can be formed at the same time as the shallow trench isolation regions 16, in the manner already described herein. The optional shallow trench isolation regions 18 can be used for, e.g., logic field effect transistors (FETs).

In addition, wells 20a, 20b are formed for NFETs and PFETs under the insulator layer 12b and within the single crystalline material region 12d between the shallow trench isolation regions 16 and the high resistivity layer 14. In embodiments, the thickness of the single crystal material region 12d and an implant energy for the wells 20a, 20b can be optimized to ensure that the wells 20a, 20b are completely separated from the high resistivity layer 14, i.e., the wells 20a, 20b do not contact or touch the high resistivity layer 14.

More specifically and still referring to FIG. 2, the wells 20a, 20b may be formed by introducing a concentration of different dopants of opposite conductivity type in the substrate, e.g., single crystal material region 12d. For example, a P-well is doped with p-type dopants, e.g., Boron (B), and the N-well is doped with n-type dopants, e.g., Arsenic (As), Phosphorus (P) and Sb, among other suitable examples. In embodiments, respective patterned implantation masks may be used to define selected areas exposed for the implantations of the different dopants for the wells 20a, 20b. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions as should be understood by those of skill in the art.

In FIG. 3, transistors 22 are formed on the substrate 12c, amongst other features, and respective fabrication processes in accordance with aspects of the present disclosure. In embodiments, the transistors 22 can also be representative of resistors and/or other back end of the line (BEOL) passive devices, e.g., MIMcaps, inductors, transmission lines etc. in back end of line (BEOL) materials.

In FIG. 3, the transistors 22 (or other devices) are formed on the substrate 12c using conventional deposition, lithography and etching processes. For example, for transistors 22, a gate dielectric material 22a and workfunction metal (or poly material) 22b are deposited on the substrate 12c using conventional deposition processes, e.g., atomic layer deposition (ALD) and CVD processes, followed by a patterning process using lithography and etching (RIE) with selective chemistries. In embodiments, the gate dielectric material 22a can be a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. Examples of the workfunction materials for a p-channel FET include Ti, TiAlC, Al, TiAl, TaN, TaAlC, TiN, TiC and Co. Examples of the workfunction materials for an n-channel FET include TiN, TaN, TaAlC, TiC, TiAl, TaC, Co, Al, TiAl, HfTi, TiSi, TaSi or TiAlC. The workfunction materials may be deposited by CVD, physical vapor deposition (PVD) including sputtering, ALD or other suitable method.

Following the patterning step, sidewall spacers 22c are formed over the patterned materials. In embodiments, the sidewall spacers 22c are formed by a conventional deposition process followed by an anisotropic etching process. The sidewalls spacers 22c can be comprised of any suitable sidewall materials. For example, the sidewall material can be a nitride material. Raised diffusion regions 22d, e.g., source and drain regions, are formed on the side of the sidewalls spacers 22c. The raised source and drain regions 22d are formed by a doped epitaxial growth process on the substrate 12c, as an example, as is known to those of skill in the art such that no further explanation is required for a complete understanding of the present disclosure. Although the transistor structures are shown to be the same in the figure, it should be understood by those of skill in the art that these could be nFETs and/or PFETs with different threshold voltages as needed. In addition, the transistors need not be processed simultaneously.

It should also be understood by those of ordinary skill in the art that transistors can be formed on layer 12d, i.e., single crystalline material region 12d, as shown representatively at reference numeral 23. In this embodiment, the high resistivity layer 14 remains below the transistor 23. The transistor 23 can be form in a similar manner as the transistor 22, but in an earlier fabrication process. In addition, other devices, e.g., active or passive devices, can be formed on single crystalline material region 12d, which would require an etching or removal of the layers 12b, 12c, prior to forming of such devices. In addition, it should be understood by those of skill in the art that the high resistivity layer 14 can be limited to below the transistor 22 (e.g., is not everywhere on the wafer) in order to reduce harmonics. For logic FETs, there is no need to have the high resistivity layer 14 below.

Figure 4:
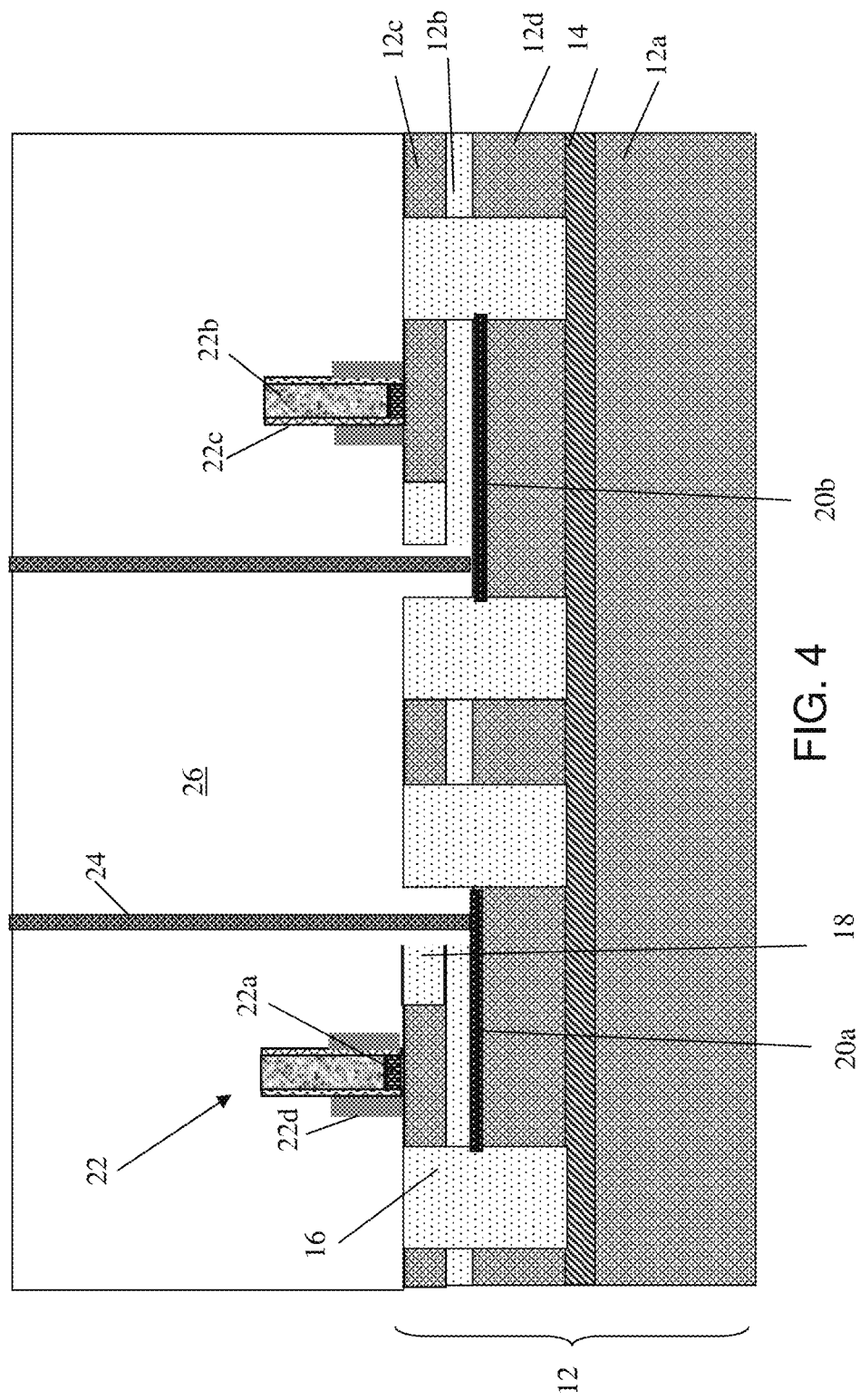
FIG. 4 shows back gate contacts, amongst other features, in accordance with aspects of the present disclosure.

FIG. 4 shows back gate contacts 24, amongst other features, in accordance with aspects of the present disclosure. In embodiments, the back gate contacts 24 are formed in a dielectric material 26 and extend to directly contact the respective wells 20a, 20b. The back gate contacts 24 can be formed between the isolation regions 16, 18. In the case that the optional isolation regions 18 are not present, the back gate contacts 24 can be formed between the isolation region 16 and the raised diffusions regions 22d of the transistors 22.

To form the back gate contacts 24 (and contacts to source and drain regions), the exposed surfaces of the wells 20a, 20b undergo a silicide process which begins with deposition of a thin transition metal layer, e.g., nickel, cobalt or titanium, followed by an anneal process to form a low-resistance transition metal silicide. Following the anneal process, metal material, e.g., tungsten or aluminum, or alloys thereof, is deposited on the silicide regions and within trenches in the dielectric material 26 to form the back side contacts 24. The trenches are formed within the dielectric material 26, the substrate 12c and insulator layer 12b to expose the underlying wells 20a, 20b. The trenches can be formed by conventional lithography and etching processes (RIE) with selective chemistries as previously described herein.

The transistors and additional structures described herein can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a handle wafer comprising a single crystalline semiconductor region;
   an insulator layer over the single crystalline semiconductor region;
   a semiconductor layer over the insulator layer;
   a high resistivity layer between semiconductor material of the handle wafer, separated from the insulator layer by the single crystalline semiconductor region; and
   a device on the semiconductor layer,
   wherein the single crystalline semiconductor region is a single crystalline Si material which completely separates the high resistivity layer from the insulator layer.

2. The structure of claim 1, wherein the device is a field effect transistor (FET).

3. The structure of claim 2, further comprising a well region under the FET, which is separated from the high resistivity layer by the single crystalline semiconductor region.

4. The structure of claim 3, wherein the high resistivity layer does not contact or touch the insulator layer and the well region.

5. The structure of claim 4, wherein the high resistivity layer is a trap rich polysilicon layer embedded within the handle wafer.

6. The structure of claim 2, further comprising back gate contacts which extend to and contact the well region under the FET.

7. The structure of claim 6, further comprising shallow trench isolation regions which isolate the FET, wherein the shallow trench isolation regions extend through the single crystalline semiconductor region, the insulator layer and the semiconductor layer to the high resistivity layer.

8. The structure of claim 7, further comprising secondary shallow trench isolation regions extending to at least the insulator layer.

9. The structure of claim 1, wherein the device is a passive device on the semiconductor layer or in back end of line materials.

10. The structure of claim 1, wherein the high resistivity layer is in selected regions only under the device on the semiconductor layer.

11. The structure of claim 1, further comprising a device on the single crystalline semiconductor region.

12. A structure comprising:
a wafer comprised of a single crystal region below a buried oxide layer and a semiconductor layer above the buried oxide layer;
at least one well formed in the single crystal region, below the buried oxide layer;
a polysilicon layer embedded within the wafer and separated from the at least one well and the buried oxide layer by the single crystal region;
a device on the semiconductor layer; and
back gate contacts extending through the semiconductor layer and contacting the at least one well.

13. The structure of claim 12, wherein the device is a field effect transistor (FET).

14. The structure of claim 12, wherein the single crystal region is a single crystalline semiconductor material of the wafer.

15. The structure of claim 14, wherein the polysilicon layer embedded within the wafer is a high resistivity layer that does not contact or touch the buried oxide layer and the at least one well.

16. The structure of claim 12, further comprising shallow trench isolation regions which isolate the device, the shallow trench isolation regions extending to and contacting the poly silicon layer.

17. The structure of claim 16, further comprising secondary shallow trench isolation regions extending to at least the insulator layer.

18. The structure of claim 12, wherein the single crystal region is a single crystalline semiconductor material which completely separates the polysilicon layer from the insulator layer and the at least one well.

19. A structure comprising at least one field effect transistor on a semiconductor on insulator wafer comprised of a high resistance poly layer separated from a buried oxide layer and a well of the at least one field effect transistor by a single crystalline region of the semiconductor on insulator wafer, wherein the high resistance poly layer is below the buried oxide layer and the well, and the high resistance poly layer does not contact either the buried oxide layer or the well.

* * * * *